(12) United States Patent
Khare et al.

(10) Patent No.: US 8,187,975 B1
(45) Date of Patent: May 29, 2012

(54) HYDROCHLORIC ACID ETCH AND LOW TEMPERATURE EPITAXY IN A SINGLE CHAMBER FOR RAISED SOURCE-DRAIN FABRICATION

(75) Inventors: Prasanna Khare, Schenectady, NY (US); Nicolas Loubet, Guilderland, NY (US); Qing Liu, Guilderland, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 12/960,736

(22) Filed: Dec. 6, 2010

(51) Int. Cl.
*H01L 21/20* (2006.01)
*H01L 21/302* (2006.01)
*H01L 21/311* (2006.01)
*H01L 21/461* (2006.01)
*H01L 21/36* (2006.01)

(52) U.S. Cl. ........ 438/689; 438/300; 438/478; 438/507; 438/695; 257/E21.09; 257/E21.132; 257/E21.219; 257/E21.431; 257/E21.634

(58) Field of Classification Search ............ 257/E21.09, 257/E21.132, E21.219, E21.431, E21.634
See application file for complete search history.

(56) References Cited

U.S. PATENT DOCUMENTS

| | | | |
|---|---|---|---|
| 5,683,924 A | 11/1997 | Chan et al. | |
| 6,277,752 B1 * | 8/2001 | Chen | 438/692 |
| 6,524,920 B1 | 2/2003 | Yu | |
| 7,491,615 B2 * | 2/2009 | Wu et al. | 438/300 |
| 2005/0275033 A1 * | 12/2005 | Zhu et al. | 257/368 |
| 2007/0269952 A1 | 11/2007 | Chong et al. | |
| 2008/0090348 A1 * | 4/2008 | Chang et al. | 438/199 |

* cited by examiner

*Primary Examiner* — Mohsen Ahmadi
(74) *Attorney, Agent, or Firm* — Gardere Wynne Sewell LLP

(57) ABSTRACT

A raised source-drain structure is formed using a process wherein a semiconductor structure is received in a process chamber that is adapted to support both an etching process and an epitaxial growth process. This semiconductor structure includes a source region and a drain region, wherein the source and drain regions each include a damaged surface layer. The process chamber is controlled to set a desired atmosphere and set a desired temperature. At the desired atmosphere and temperature, the etching process of process chamber is used to remove the damaged surface layers from the source and drain regions and expose an interface surface. Without releasing the desired atmosphere and while maintaining the desired temperature, the epitaxial growth process of the process chamber is used to grow, from the exposed interface surface, a raised region above each of the source and drain regions.

17 Claims, 2 Drawing Sheets

HYDROCHLORIC ACID ETCH AND LOW TEMPERATURE EPITAXY IN A SINGLE CHAMBER FOR RAISED SOURCE-DRAIN FABRICATION

BACKGROUND

1. Technical Field

The present invention relates generally to semiconductor fabrication processes and, more particularly, to a semiconductor fabrication process useful in building a transistor having a raised source-drain structure.

2. Description of Related Art

A transistor having a raised source-drain structure is well known in the art. There are a number of recognized fabrication processes for building such a transistor. These processes share in common a fabrication step for selectively depositing semiconductor material above the source region and drain region of a partially constructed transistor. This selective deposition of semiconductor material to form the raised source-drain structure is commonly accomplished through selective epitaxial growth.

FIG. 1 shows a cross-section of semiconductor structure for a partially constructed MOS-type transistor. The semiconductor structure includes a transistor gate 10 formed above a substrate 12 (for example, a silicon substrate including, if desired, doping). The transistor gate 10 includes, for example, a gate oxide 14, a gate conductor 16, an off-set spacer 18, a liner 20 and a sidewall spacer 22. The substrate 12 includes doped regions 24 on either side of the transistor gate 10 defining the source region and drain region (such regions including, although not specifically illustrated, lightly doped structures, heavily doped structures, extensions and/or halo implants as known in the art). A channel region 26 of the transistor is positioned between the doped regions 24 and underneath the transistor gate 10. Those skilled in the art are well aware of suitable fabrication processes for forming the semiconductor structure with the partially constructed MOS-type transistor shown in FIG. 1.

As a result of the fabrication processes used to reach the partially constructed MOS-type transistor shown in FIG. 1, those skilled in the art recognize that the upper surface 28 of the substrate 12 at the doped regions 24 (comprising the source region and the drain region) can become damaged. For example, this damage could be the result of the performance of one or more plasma etching operations or other fabrication or treatment processes used to define the transistor gate 10. This results in the presence of a damaged surface layer 30 at the upper surface 28 of each of the doped regions 24.

In the context of forming a raised source-drain structure above the doped regions 24, it is important to provide a high quality interface between the doped regions 24 and the overlying raised source-drain structure produced by subsequent epitaxial growth. The damaged surface layer 30 is not considered by those skilled in the art to present an acceptable high quality interface for a raised source-drain structure. Prior art semiconductor transistor fabrication processes accordingly teach placing the semiconductor structure of FIG. 1 in a first process chamber 80 and subjecting the semiconductor structure to a treatment and cleaning process (such as an $O_2$ plasma flash with oxide and $H_2$ cleaning) so as to remove damaged surface layer 30 at each of the doped regions 24. The prior art further teaches using the first process chamber 80 to further subject the semiconductor structure to a reactive ion etch (RIE) so as to remove damaged surface layer 30 at each of the doped regions 24. FIG. 2 shows a cross-section of the semiconductor structure with the partially constructed MOS-type transistor following processing in the first chamber to remove the damaged surface layer 30.

The advantage of performing RIE etching along with the other treatment and cleaning processes (such as an $O_2$ plasma flash with oxide and $H_2$ cleaning), as opposed to solely using the other treatment and cleaning processes, to remove damaged surface layer 30 at each of the doped regions 24, is that the use of the RIE etch process produces a clean interface surface 32 suitable for supporting subsequent epitaxial growth to form the overlying raised source-drain structure. An additional advantage to using the RIE etch process is that the subsequent epitaxial growth to form the overlying raised source-drain structure has a growth rate that is doping independent.

A disadvantage of performing RIE etching (and with respect to the use of other treatment and cleaning processes, as well) to remove damaged surface layer 30 is that a subsequent high temperature pre-bake process is required to prepare the interface surface 32 of the doped regions 24 before beginning epitaxial growth and forming the overlying raised source-drain structure. So, a next step in the prior art fabrication process comprises subjecting the semiconductor structure as shown in FIG. 2 to a pre-bake treatment 82. It is recognized, however, that the pre-bake treatment 82 with a high thermal budget results in a significant diffusion of dopants for the source-drain extensions and halo implants. Thus, it is desired to minimize that the thermal budget preparing the interface surface 32 as much as possible. Nonetheless, the pre-bake operation is typically performed at a relatively high temperature at or exceeding approximately 800° C., and some undesired dopant diffusion will necessarily occur.

Following completion of the pre-bake and preparation of the interface surface 32, a selective epitaxial growth is performed so as to deposit semiconductor material forming the raised source-drain structures 34 over the doped regions 24. It is important to note that the process for selective epitaxial growth from the interface surface 32 is performed in a second process chamber 84 (i.e., a process chamber 84 different from the first process chamber 80 used RIE etching and the removal of damaged surface layer 30). FIG. 3 shows a cross-section of a semiconductor structure with a partially constructed MOS-type transistor following processing in the second chamber 84 to epitaxially grow the raised source-drain structures 34 from the interface surface 32. Then use of RIE etching to remove the damaged surface layer 30 and prepare the interface surface 32 for epitaxial growth is preferred because the resulting semiconductor structure does not exhibit a "seam" (or there is only a minimal seam) or interface at the interface surface 32 between the doped regions 24 and the raised source-drain structures 34.

The higher the thermal budget for the pre-bake, the higher the quality of the clean interface surface 32. However, the higher the thermal budget the greater the undesired degree of dopant diffusion with respect to the source-drain extensions and halo implants. Thus, those skilled in the art using the known prior art processes for fabricating transistors with raised source-drain structures must trade-off the advantage of a clean interface surface 32 against the disadvantage of higher dopant diffusion. For example, a lower temperature cleaning and a lower temperature pre-bake may address issues with respect to excessive undesired dopant diffusion of the source-drain extensions and halo implants, but produce a lower quality interface surface 32 for epitaxial growth of the raised source-drain regions with a distinct "seam" interface exhibiting oxygen and/or carbon concentrations. Conversely, a high temperature pre-bake may produce a cleaner interface surface for satisfactory epitaxial growth of the raised source-drain regions, but produce an unacceptable degree of extension and halo implant dopant diffusion.

There is a need in the art for an improved process for fabricating raised source-drain structures that addresses the foregoing, and other, deficiencies, limitations and trade-offs noted with respect to the prior art processes and fabrication techniques. In particular, there would be an advantage to a process for forming raised source-drain structures with clean interface surfaces using a lower thermal budget that did not produce unacceptable dopant diffusion.

SUMMARY

In an embodiment, a process comprises: receiving a semiconductor structure in a process chamber adapted to support both an etching process and an epitaxial growth process, the semiconductor structure including a source region and a drain region, wherein the source and drain regions each include a damaged surface layer; preparing a controlled atmosphere within the process chamber; performing an etch to remove the damaged surface layers from the source and drain regions and expose an interface surface; and without releasing the controlled atmosphere, and within the same process chamber, performing an epitaxial growth to grow, from the exposed interface surface, a raised region above each of the source and drain regions.

In an embodiment, a process comprises: receiving a semiconductor structure in a process chamber adapted to support both an etching process and an epitaxial growth process, the semiconductor structure including a source region and a drain region, wherein the source and drain regions each include a damaged surface layer; preparing a controlled atmosphere within the process chamber; setting a temperature within the process chamber at less than 800° C.; performing, at the controlled atmosphere and at the set temperature, an etch with hydrochloric acid to remove the damaged surface layers from the source and drain regions and expose an interface surface; and without releasing the controlled atmosphere and with maintaining the set temperature, performing within the same process chamber a cyclical epitaxial growth to grow, from the exposed interface surface, a raised region above each of the source and drain regions.

In an embodiment, a process comprises: receiving a semiconductor structure in a process chamber adapted to support both an etching process and an epitaxial growth process, the semiconductor structure including a source region and a drain region, wherein the source and drain regions each include a damaged surface layer; drawing substantially a vacuum within the process chamber; using the process chamber at the drawn vacuum and the supported etching process to remove the damaged surface layers and expose an etched interface surface at each of the source region and drain region; and using the process chamber maintained at the drawn vacuum and the supported epitaxial growth process to grow from the exposed etched interface surface a raised region above each of the source and drain regions.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 4:
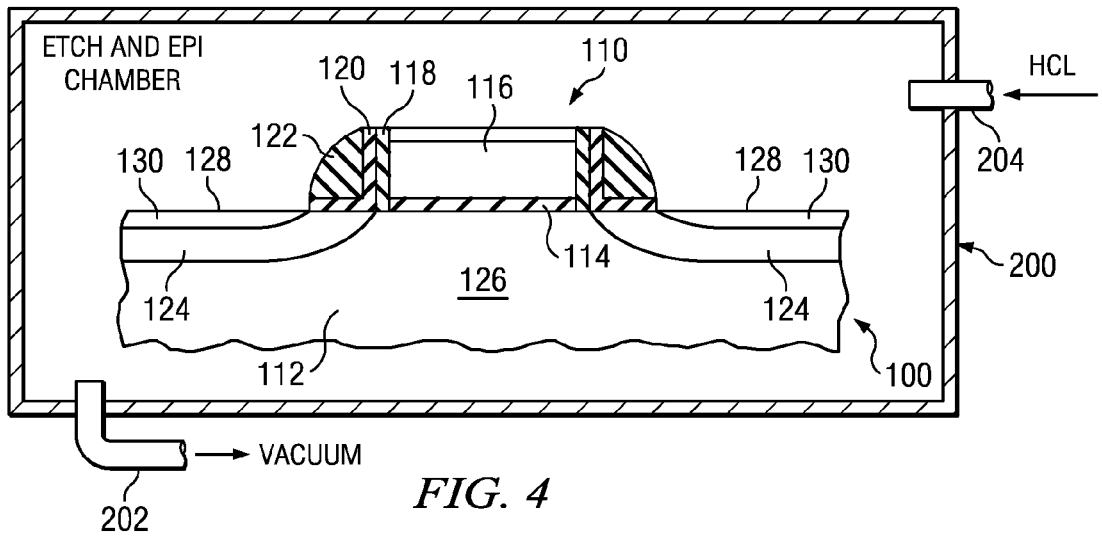
FIGS. 4 to 6 illustrate a cross-section of a partially constructed MOS-type transistor in accordance with an exemplary process of the present invention for fabricating a raised source-drain structure on a semiconductor structure.
Figure 5:
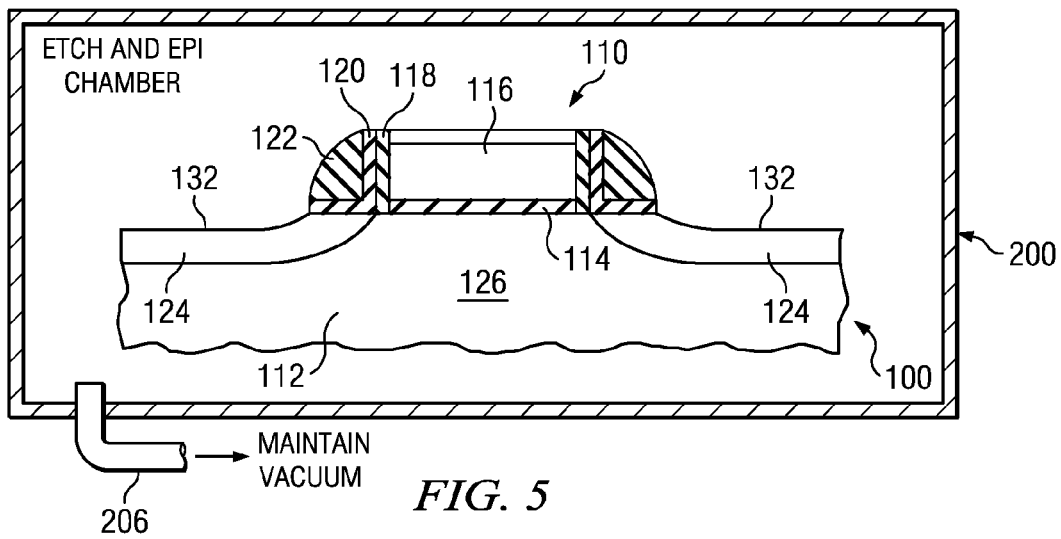
Figure 6:
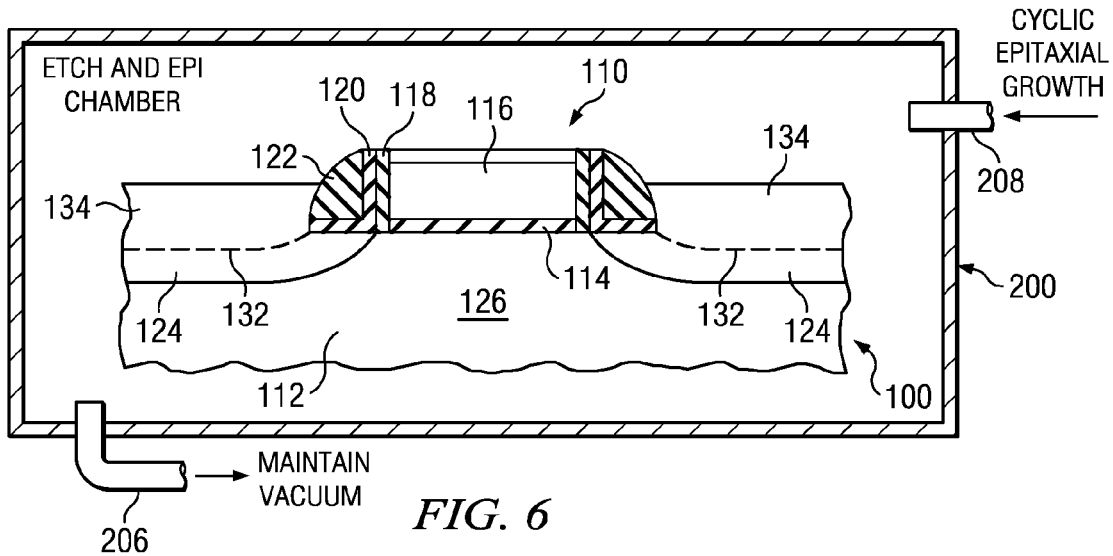

Reference is now made to FIGS. 4 to 6 which illustrate a cross-section of a partially constructed MOS-type transistor in accordance with an exemplary process of the present invention for fabricating a raised source-drain structure on a semiconductor structure.

Figure 3:
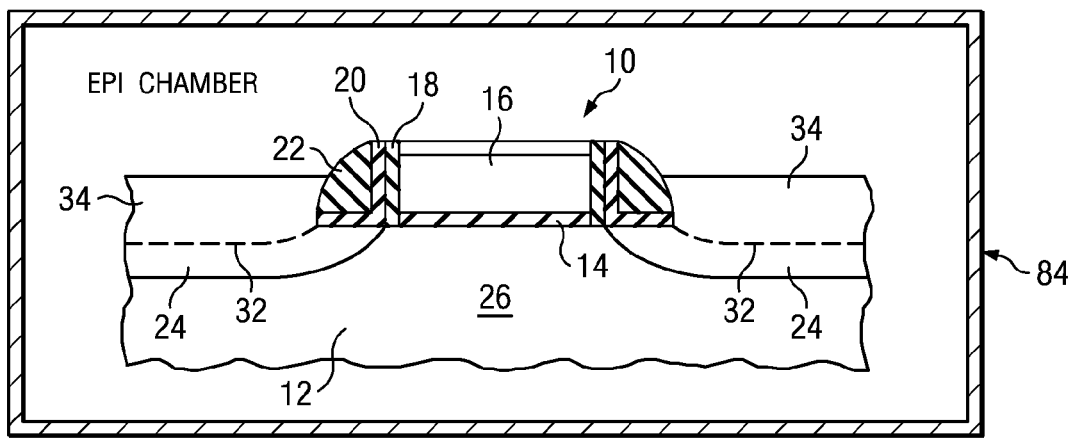

A semiconductor structure 100 is shown for a partially constructed MOS-type transistor. The structure 100 includes a transistor gate 110 formed above a substrate 112 (for example, a silicon substrate including, if desired, doping). The transistor gate 110 includes, for example, a gate oxide 114, a gate conductor 116, an off-set spacer 118, a liner 120 and a sidewall spacer 122. The substrate 112 includes doped regions 124 on either side of the transistor gate 110 defining the source region and drain region (such regions including, although not specifically illustrated, lightly doped structures, heavily doped structures, extensions and/or halo implants as known in the art). A channel region 126 is positioned between the doped regions 124 and underneath the transistor gate 110. Those skilled in the art are well aware of suitable fabrication processes for forming the partially constructed MOS-type transistor for the semiconductor structure 100 shown in FIG. 3.

As a result of the fabrication processes used to reach the partially constructed MOS-type transistor with the semiconductor structure 100 shown in FIG. 4, those skilled in the art recognize that the upper surface 128 of the substrate 112 at the doped regions 124 (for the source region and the drain region) can become damaged. For example, this damage could be the result of the performance of one or more plasma etching operations or other fabrication or treatment processes used to define the transistor gate 110. This results in the presence of a damaged surface layer 130 at the upper surface 128 of each of the doped regions 124.

The semiconductor structure 100 shown in FIG. 4 is placed within a process chamber 200. The process chamber 200 is of the type configured and suited to perform an in-situ etch and epitaxial growth. In other words, the process chamber 200 is capable of receiving a structure, producing a controlled atmosphere (such as a vacuum), performing an etch on the received structure, and performing an epitaxial growth on the received structure after etching, in a sequential fashion without breaking the controlled atmosphere (vacuum) and while maintaining certain process temperature settings.

Once the semiconductor structure 100 is received within the process chamber 200, the chamber is sealed and a controlled atmosphere is created (for example, by drawing a vacuum 202). After the controlled atmosphere has been successfully created, the process chamber 200 implements an etching process. In a preferred implementation, the etching process is performed as an in-situ etch of the doped regions 124 (for example, a silicon etch) using hydrochloric acid (HCl) 204 with a carrier gas (such as hydrogen). This etch is selective as to the doped regions 124, and thus does not affect the structure of the transistor gate 110 (for example, if a standard dielectric hard-mask is used on the transistor gate structure). The etch 204 does, however, remove (at least) the damaged surface layer 130 at each of the doped regions 124.

Prior to performing the etch 204, any suitable standard surface preparation process, such as HF-last (i.e., hydrofluoric acid last surface preparation process) or COR-last (i.e. chemical oxide removal last surface preparation process), may be performed on the semiconductor structure 100 within the chamber 200. The etch is performed at a set chamber temperature of, for example, 650-750° C. (it being recognized that setting the temperature in this manner has a negligible effect on dopant diffusion).

FIG. 5 shows a cross-section of the semiconductor structure 100 for the partially constructed MOS-type transistor following processing in the chamber 200 to remove damaged surface layer 130. It will be noted that the etch 204 (FIG. 4) has been terminated, but the vacuum 202 (FIG. 4) has been maintained 206 (i.e., there is no break in the controlled atmosphere following completion of the etch 204). Preferably, the temperature is also maintained. The removal of the damaged surface layer 130 at each of the doped regions 124 using the etch 204 produces a clean interface surface 132 upon which subsequent epitaxial growth may occur to form an overlying raised source-drain structure. An additional advantage to using the etch 204 process is that the subsequent epitaxial growth to form the overlying raised source-drain structure has growth rate which is doping independent. Still further, use of the etch 204, along with continued processing in the chamber 200, obviates the need to perform a pre-bake prior to epitaxial growth (and thus unacceptably expose the substrate to an undesired dopant diffusing higher thermal budget).

A selective epitaxial growth 208 (in a cyclical process) is then performed within the chamber 200 so as to deposit semiconductor material forming the raised source-drain structures 134 over the doped regions 124 by means of growth (for example, silicon growth) from the clean interface surface 132 of the substrate. It is important to note that the process for selective epitaxial growth is performed in the same process chamber 200 as was used to perform the selective etch 204 for removing the damaged surface layer 130. FIG. 6 shows a cross-section of the semiconductor structure 100 for the partially constructed MOS-type transistor following processing in the second chamber to epitaxially grow the raised source-drain structures 134. The use of etching 204 to remove the damaged surface layer 130 prepares the structure 100 for an epitaxial growth that does not exhibit a "seam" (or there is only a minimal seam) or interface at the interface surface 132 between the doped regions 124 and the raised source-drain structures 134. It will be noted that the vacuum 202 (FIG. 4) continues to be maintained 206 (i.e., there is no break in the controlled atmosphere) at least until completion of the selective epitaxial growth 208 operation. Preferably, the temperature is also maintained. Thus, the selective epitaxial growth 208 is performed at the same temperature of, for example, 650-750° C., as the etch 204 (and thus has a negligible effect on dopant diffusion).

Figure 1:
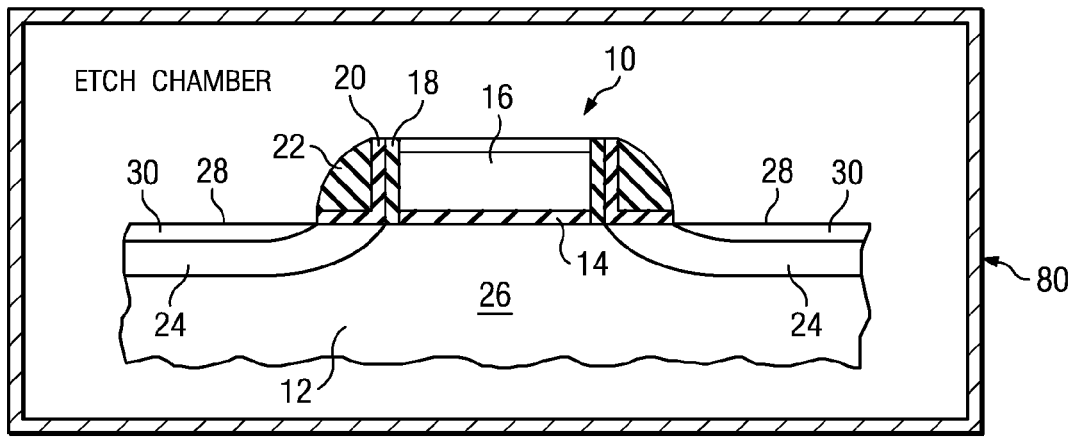
FIGS. 1 to 3 illustrate a cross-section of a partially constructed MOS-type transistor in accordance with a prior art process for fabricating a raised source-drain structure.
Figure 2:
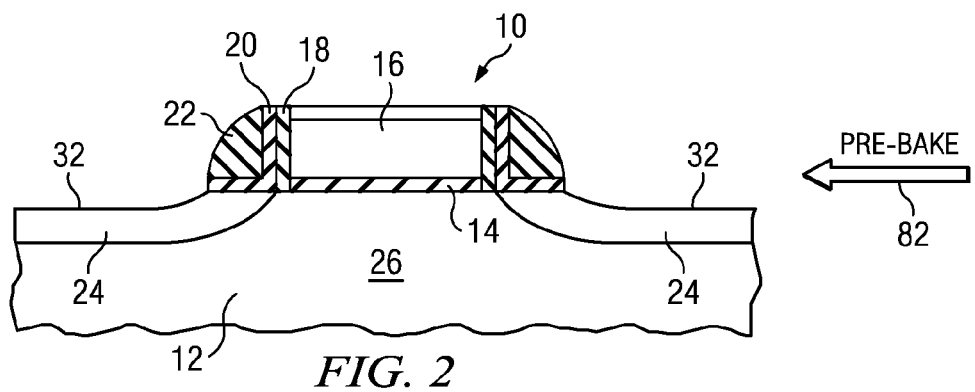

The interface surface 132 is a very clean interface because the in-situ etch and epitaxial growth are performed in the same chamber 200 (reactor). The resulting transistor will exhibit lower leakage and lower resistance than a comparable transistor formed in accordance with the prior art process shown in FIGS. 1 to 3.

The use of a cyclic process for the selective epitaxial growth 208 advantageously results in no parasitic growth at the corners of the transistor gate 110 (even if the protective hard mask coverage is weak at those corners).

The use of a lower temperature epitaxial growth process to produce the raised source-drain structures 134 serves to suppress dopant diffusion as a result of the epitaxial process. This results in a significantly improved raised source-drain structure than could be obtained with the high thermal budget process for epitaxial growth used with the prior art process shown in FIGS. 1 to 3. The suppression of dopant diffusion with the raised source-drain process described above produces a transistor with better electrostatics (short channel effects—SCE).

Performing epitaxial growth immediately after performing the etch in the same chamber advantageously results in seamless growth from the interface surface at the source and drain regions.

The remaining process steps for completing fabrication of the transistor, such as adding the dielectric layer, forming contacts to the source, drain and gate, adding metallization layers, and the like are well known to those skilled in the art and will not be discussed.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process, comprising:
   receiving a semiconductor structure in a process chamber adapted to support both an etching process and an epitaxial growth process, the semiconductor structure including a source region and a drain region, wherein the source and drain regions each include a damaged surface layer;
   preparing a controlled atmosphere within the process chamber;
   performing within the process chamber an etch process to remove the damaged surface layers from the source and drain regions and expose an interface surface using only hydrochloric acid with a hydrogen carrier gas; and
   without releasing the controlled atmosphere in the process chamber, without performing an intervening pre-bake of the etched semiconductor structure and within the same process chamber, performing an epitaxial growth to grow, from the exposed interface surface, a raised region above each of the source and drain regions.

2. The process of claim 1, further comprising, prior to performing the etch, performing a surface preparation on the semiconductor structure.

3. The process of claim 2, wherein the surface preparation comprises a selected one of an HF-last process or a COR-last process.

4. The process of claim 1, wherein performing the etch and performing the epitaxial growth comprises maintaining substantially a same controlled atmosphere within the process chamber during etch and epitaxial growth.

5. The process of claim 4, wherein the same controlled atmosphere is substantially a vacuum.

6. The process of claim 1, wherein performing the etch and performing the epitaxial growth comprises maintaining substantially a same temperature within the process chamber during etch and epitaxial growth.

7. The process of claim 6, wherein the same temperature is about between 650-750° C.

8. The process of claim 1, wherein performing the epitaxial growth comprises performing a cyclic epitaxial growth.

9. The process of claim 1, wherein the process further comprises controlling a temperature within the chamber to be less than 800° C. prior to performing the epitaxial growth.

10. A process, comprising:
- receiving a semiconductor structure in a process chamber adapted to support both an etching process and an epitaxial growth process, the semiconductor structure including a source region and a drain region, wherein the source and drain regions each include a damaged surface layer;
- preparing a controlled atmosphere within the process chamber;
- setting a temperature within the process chamber at less than 800° C.;
- performing within the process chamber, at the controlled atmosphere and at the set temperature, an etch process using only hydrochloric acid with a hydrogen carrier gas to remove the damaged surface layers from the source and drain regions and expose an interface surface; and
- without releasing the controlled atmosphere in the process chamber, without performing an intervening pre-bake of the etched semiconductor structure and with maintaining the set temperature, performing within the same process chamber a cyclical epitaxial growth to grow, from the exposed interface surface, a raised region above each of the source and drain regions.

11. The process of claim 10, wherein the controlled atmosphere is substantially a vacuum, and wherein the set temperature is about between 650-750° C.

12. The process of claim 10, further comprising, prior to performing the etch, performing a surface preparation on the semiconductor structure.

13. The process of claim 12, wherein the surface preparation comprises a selected one of an HF-last process or a COR-last process.

14. A process, comprising:
- receiving a semiconductor structure in a process chamber adapted to support both an etching process and an epitaxial growth process, the semiconductor structure including a source region and a drain region, wherein the source and drain regions each include a damaged surface layer;
- drawing substantially a vacuum within the process chamber;
- in the process chamber at the drawn vacuum, using only hydrochloric acid with a hydrogen carrier gas in an etch process to remove the damaged surface layers and expose an etched interface surface at each of the source region and drain region; and
- using the same process chamber maintained at the drawn vacuum and the supported epitaxial growth process to grow from the exposed etched interface surface a raised region above each of the source and drain regions,
- wherein the process does not include performing pre-bake of the semiconductor structure prior to performing the epitaxial growth.

15. The process of claim 14, further comprising, prior to performing the etch, performing a surface preparation on the semiconductor structure.

16. The process of claim 14, wherein performing the etch and performing the epitaxial growth comprises maintaining substantially a same temperature within the process chamber.

17. The process of claim 16, wherein the same temperature is about between 650-750° C.

* * * * *